(12) United States Patent
Vella et al.

(10) Patent No.: US 10,800,948 B2
(45) Date of Patent: Oct. 13, 2020

(54) CONDUCTIVE ADHESIVE COMPOSITIONS AND METHOD FOR THE SAME

(71) Applicant: XEROX CORPORATION, Norwalk, CT (US)

(72) Inventors: Sarah J. Vella, Milton (CA); Guiqin Song, Milton (CA)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 16/277,772

(22) Filed: Feb. 15, 2019

(65) Prior Publication Data

US 2020/0040230 A1    Feb. 6, 2020

Related U.S. Application Data

(60) Provisional application No. 62/713,936, filed on Aug. 2, 2018.

(51) Int. Cl.
| | |
|---|---|
| *H01B 1/02* | (2006.01) |
| *C09J 9/02* | (2006.01) |
| *C09J 163/00* | (2006.01) |
| *H05K 3/32* | (2006.01) |
| *C08K 3/08* | (2006.01) |
| *C08K 5/17* | (2006.01) |

(52) U.S. Cl.
CPC .............. *C09J 9/02* (2013.01); *C09J 163/00* (2013.01); *H01B 1/02* (2013.01); *H05K 3/321* (2013.01); *C08K 3/08* (2013.01); *C08K 5/17* (2013.01); *C09J 2400/16* (2013.01); *H05K 2203/0759* (2013.01); *H05K 2203/12* (2013.01)

(58) Field of Classification Search
CPC ........ C09J 9/02; C09J 163/00; C09J 2400/16; H05K 3/321; H05K 2203/12; H05K 2203/0759; H05K 3/323; C08K 3/08; C08K 5/17; C08K 2201/001; H01B 1/02
See application file for complete search history.

(56) References Cited

U.S. PATENT DOCUMENTS 5,062,896 A * 11/1991 Huang .................. B23K 35/26
106/287.19
7,078,095 B2   7/2006 Tam
(Continued)

FOREIGN PATENT DOCUMENTS

| CN | 107452436 A | * | 12/2017 | ............... H01B 1/22 |
| WO | WO-2018025903 A1 | * | 2/2018 | ............... C22C 9/02 |

OTHER PUBLICATIONS

Hisert, J. "A Guide to Low Temperature Solder Alloys," https://www.indium.com/blog/a-guide-to-low-temperature-solder-alloys.php, Jul. 11, 2017 (Year: 2017).*

(Continued)

*Primary Examiner* — Mark Kopec
*Assistant Examiner* — Jaison P Thomas
(74) *Attorney, Agent, or Firm* — MH2 Technology Law Group LLP (57) ABSTRACT

Conductive adhesive compositions, jettable ink adhesive compositions, printed electronics incorporating the conductive adhesive compositions, and methods for preparing the same are provided. The conductive adhesive composition may include a eutectic metal alloy, an amine, and a solvent, and the eutectic metal alloy may include gallium, indium, and optionally tin.

19 Claims, 2 Drawing Sheets

(56) References Cited

U.S. PATENT DOCUMENTS

| | | | |
|---|---|---|---|
| 7,294,358 B2 | 11/2007 | Tam | |
| 8,852,463 B2 * | 10/2014 | Ishikawa | B22F 1/0062 |
| | | | 252/512 |
| 9,574,045 B2 * | 2/2017 | Yamada | C08G 59/38 |
| 10,119,586 B2 | 11/2018 | Merlo et al. | |
| 2003/0227959 A1 * | 12/2003 | Balian | H01L 23/3736 |
| | | | 374/161 |
| 2012/0043512 A1 | 2/2012 | Liu et al. | |
| 2014/0374079 A1 * | 12/2014 | Zinn | C09J 11/02 |
| | | | 165/185 |
| 2017/0183536 A1 | 6/2017 | Song et al. | |
| 2017/0355871 A1 | 12/2017 | Song et al. | |
| 2018/0188771 A1 * | 7/2018 | Dabby | H05K 1/038 |
| 2018/0242451 A1 * | 8/2018 | Chopra | H01B 1/16 |
| 2019/0182966 A1 * | 6/2019 | Yamamoto | H05K 3/3489 |

OTHER PUBLICATIONS

Cinar, et al., Mechanical Fracturing of Core-Shell Undercooled Metal Particles for Heat-Free Soldering, Scientific Reports 2016, 6:21864.

Co-pending U.S. Appl. No. 16/277,545, entitled "Compositions Comprising Eutectic Metal Alloy Nanoparticles," filed Feb. 15, 2019.

Co-pending U.S. Appl. No. 16/277,589, entitled "Adhesive Composition Comprising Eutectic Metal Alloy Nanoparticles," filed Feb. 15, 2019.

Co-pending U.S. Appl. Serial No. 16/277,664, entitled "Adhesive Composition Comprising Metal Nanoparticles," filed Feb. 15, 2019.

Tevis, et al., Synthesis of Liquid Core—Shell Particles and Solid Patchy Multicomponent Particles by Shearing Liquid Into Complex Particles (SLICE), Langmuir 2014, 30(47): pp. 14308-14313.

* cited by examiner

CONDUCTIVE ADHESIVE COMPOSITIONS AND METHOD FOR THE SAME

CROSS-REFERENCE TO RELATED APPLICATIONS

This application claims priority to U.S. Provisional Patent Application No. 62/713,936, filed Aug. 2, 2018, the contents of which are incorporated herein by reference in its entirety.

TECHNICAL FIELD

The presently disclosed embodiments or implementations are directed to conductive adhesive compositions for hybrid and printed electronics.

BACKGROUND

The printed electronics industry aims to provide low cost electronic components and add functionality to otherwise inanimate objects. The printed electronics industry, however, is still in its infancy; and thus, has not been capable of achieving the standards of conventional silicon technology. As such, efforts have been directed toward hybrid electronics that combine conventional silicon technologies with the low cost of printed electronics. For example, in hybrid electronics, silicon-based microchips are often electrically or conductively coupled with printed circuits. In order to electrically couple the silicon-based microchips to the printed circuits, however, a conductive material is often required. While conventional silicon technologies utilize robust interconnects (e.g., solder balls, wire-bonding, etc.) to couple the microchips to the printed circuits, these conventional interconnects are insufficient for hybrid technologies.

In view of the foregoing, conductive adhesives are often utilized to couple the microchips to the printed circuits in hybrid electronics. Conventional conductive adhesives often include a mixture of adhesive pastes and a conductive component, such as micron-sized silver flakes. The viscosity of the adhesive pastes and the relatively large size of the conductive components in conventional conductive adhesives, however, impedes the jetting (e.g., aerosol jet or inkjet printing) or printability of these materials. Further, curing temperatures and times of conventional conductive adhesives often prevent their application on polymeric or plastic substrates, which require relatively lower curing temperatures and times.

What is needed, then are improved conductive adhesive compositions and methods for preparing the same.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

The present disclosure may provide a conductive adhesive composition or a jettable ink adhesive composition, including a eutectic metal alloy, an amine, and a solvent.

In some examples, the eutectic metal alloy may include gallium and indium.

In some examples, the eutectic metal alloy may include from about 72% to about 84% gallium, and from about 15% to about 27% indium.

In some examples, the eutectic metal alloy may further include tin.

In some examples, the eutectic metal alloy may include from about 60% to about 72% gallium, from about 8% to about 18% indium, and from about 14% to about 26% tin.

In some examples, the amine may be selected from the group consisting of propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, N,N,N',N'-tetramethylbutane-1,4-diamine, 3-methoxypropylamine, pentaethylenehexamine, 2,2-(ethylenedioxy)diethylamine, tetraethylenepentamine, triethylenetetramine, diethylenetriamine, and combinations thereof.

In some examples, the amine may consist of or only include tetraethylenepentamine.

In some examples, the solvent may include propylene glycol monomethyl ether acetate.

In some examples, the conductive adhesive composition may further include an epoxy resin.

The present disclosure may also provide a method for preparing a conductive adhesive composition, including contacting a eutectic metal alloy with an amine in a solvent to prepare liquid metal particles of the eutectic metal alloy dispersed in the solvent.

In some examples, the eutectic metal alloy may include gallium and indium.

In some examples, the eutectic metal alloy may include from about 72% to about 84% gallium, and from about 15% to about 27% indium.

In some examples, the eutectic metal alloy may further include tin.

In some examples, the eutectic metal alloy may include from about 60% to about 72% gallium, from about 8% to about 18% indium, and from about 14% to about 26% tin.

In some examples, the amine may include tetraethylenepentamine.

In some examples, the solvent may include propylene glycol monomethyl ether acetate.

In some examples, the method may further include contacting the liquid metal particles with an epoxy resin.

The present disclosure may further provide a conductive adhesive composition prepared according to any of the proceeding methods.

The present disclosure may also provide a printed electronic. The printed electronic may include a flexible substrate, a plurality of conductive terminals, a conductive adhesive composition disposed adjacent the conductive terminals, wherein the conductive adhesive composition includes a eutectic metal alloy, an amine, and a solvent, and an electronic component disposed adjacent the conductive adhesive composition. In at least one example, the plurality of conductive terminals may be electrically coupled with one another via the conductive adhesive composition and the electronic component In at least one example, the plurality of conductive terminals are electrically coupled with one another only via the conductive adhesive composition and the electronic components.

BRIEF DESCRIPTION OF THE DRAWINGS

The accompanying drawings, which are incorporated in and constitute a part of this specification, illustrate embodiments of the present teachings. These and/or other aspects and advantages in the embodiments of the disclosure will become apparent and more readily appreciated from the following description of the various embodiments, taken in conjunction with the accompanying drawings of which.

DETAILED DESCRIPTION

The following description of various typical aspect(s) is merely exemplary in nature and is in no way intended to limit the disclosure, its application, or uses.

As used throughout, ranges are used as shorthand for describing each and every value that is within the range. Any value within the range may be selected as the terminus of the range. In addition, all references cited herein are hereby incorporated by reference in their entireties. In the event of a conflict in a definition in the present disclosure and that of a cited reference, the present disclosure controls.

Unless otherwise specified, all percentages and amounts expressed herein and elsewhere in the specification should be understood to refer to percentages by weight. The amounts given are based on the active weight of the material.

Additionally, all numerical values are "about" or "approximately" the indicated value, and take into account experimental error and variations that would be expected by a person having ordinary skill in the art. It should be appreciated that all numerical values and ranges disclosed herein are approximate values and ranges, whether "about" is used in conjunction therewith. It should also be appreciated that the term "about," as used herein, in conjunction with a numeral refers to a value that may be ±0.01% (inclusive), ±0.1% (inclusive), ±0.5% (inclusive), ±1% (inclusive) of that numeral, ±2% (inclusive) of that numeral, ±3% (inclusive) of that numeral, ±5% (inclusive) of that numeral, ±10% (inclusive) of that numeral, or ±15% (inclusive) of that numeral. It should further be appreciated that when a numerical range is disclosed herein, any numerical value falling within the range is also specifically disclosed.

As used herein, the term "or" is an inclusive operator, and is equivalent to the term "and/or," unless the context clearly dictates otherwise. The term "based on" is not exclusive and allows for being based on additional factors not described, unless the context clearly dictates otherwise. In the specification, the recitation of "at least one of A, B, and C," includes embodiments containing A, B, or C, multiple examples of A, B, or C, or combinations of A/B, A/C, B/C, A/B/B/BB/C, AB/C, etc. In addition, throughout the specification, the meaning of "a," "an," and "the" include plural references. The meaning of "in" includes "in" and "on."

The present inventors have surprisingly and unexpectedly discovered that particles of liquid metal could be isolated with diameters of less than 1 µm. The present inventors have also surprisingly and unexpectedly discovered that the particles could then be incorporated into conductive adhesive compositions that could be printed using an aerosol jet printer.

Compositions

Embodiments disclosed herein may be or include a conductive adhesive composition, such as a jettable conductive adhesive composition. For example, the conductive adhesive composition disclosed herein may be an inkjet printable conductive adhesive composition suitable for printable electronics and/or plastic and rigid substrates. The conductive adhesive composition may include one or more eutectic metal alloys and one or more amines dispersed in a solvent. For example, the conductive adhesive composition may include a eutectic metal alloy of gallium, indium, and optionally tin, and one or more amines dispersed in a propylene glycol monomethyl ether acetate (PGMEA) solvent.

The conductive adhesive composition may be suitable for use with jetting applications, including aerosol jet printing. The conductive adhesive composition may also be suitable used for varying substrates, including, but not limited to, polymeric or plastic substrates. The conductive adhesive composition may also be air stable at room temperature.

A viscosity of the conductive adhesive composition may vary widely. In at least one embodiment, the conductive adhesive composition may have a viscosity of from about 1000 cP to about 2500 cP at 25° C. For example, the viscosity of the conductive adhesive composition may be from about 1000 cP to about 2500 cP, about 1200 cP to about 2200 cP, about 1500 cP to about 2000 cP, or from about 1600 cP to about 1800 cP. In another embodiment, the conductive adhesive composition may have a viscosity less than about 3000 cP, less than about 2800 cP, less than about 2500 cP, less than about 2300 cP, or less than about 2000 cP.

The conductive adhesive composition may have a measured conductivity of from about 800 S/cm to about 2000 S/cm. For example, the conductive adhesive composition may have a measured conductivity of from about 800 S/cm to about 2000 S/cm, about 1000 S/cm to about 1800 S/cm, or about 1200 S/cm to about 1500 S/cm. In another embodiment, the conductive adhesive composition may have a measured conductivity of greater than about 800 S/cm, greater than about 900 S/cm, greater than about 1000 S/cm, greater than about 1100 S/cm, or greater than about 1200 S/cm.

The conductive adhesive composition may have a resistivity that may be less than about $1.0 \times 10^{-4}$ ohms-centimeter (ohms-cm), less than about $2.0 \times 10^{-5}$ ohms-cm, less than about $1.25 \times 10^{-5}$ ohms-cm, less than about $1.0 \times 10^{-5}$ ohms-cm, less than about $8.0 \times 10^{-6}$ ohms-cm, less than about $6.6 \times 10^{-6}$ ohms-cm or less than about $5.0 \times 10^{-6}$ ohms-cm. Typically, the resistance may be from about $2.0 \times 10^{-5}$ ohms-cm to about $5.0 \times 10^{-6}$ ohms-cm, such as about $1.25 \times 10^{-5}$ ohms-cm to about $6.6 \times 10^{-6}$ ohms-cm, such as about $1.0 \times 10^{-5}$ ohms-cm to about $8.0 \times 10^{-6}$ ohms-cm.

Eutectic Metal Alloy

The adhesive conductive composition may include one or more eutectic metal alloys. As used herein, the term or expression "alloy" may refer to a solid or liquid mixture of two or more metals and optionally one or more non-metals, or of one or more metals and one or more non-metals. As used herein, the term or expression "eutectic" may refer to the lowest melting point of an alloy or solution of two or more substances, such as metals, that is obtainable by varying the proportions of its components. As such, it should be appreciated that the eutectic metal alloy may be a mixture that may melt at a single temperature or eutectic point.

The eutectic metal alloy may have a eutectic point relatively lower than a melting point of a substrate upon which the adhesive conductive composition may be deposited. For example, the substrate may be a polymeric or plastic substrate (e.g., rigid or flexible plastic substrate) and the eutectic metal alloy may have a melting point relatively lower than the plastic substrate. In at least one embodiment, the eutectic metal alloy may be a liquid at room temperature. For example, the eutectic metal alloy may have a melting point or eutectic point relatively lower than room temperature. For example, the melting point of the eutectic metal alloy may be less than about 30° C., less than about 25° C., less than about 20° C., or less than about 15° C. In another example, the melting point of the eutectic metal alloy may be from about 10° C. to about 30° C., about 15° C. to about 25° C., or about 20° C. to about 23° C.

The eutectic metal alloy may include gallium, indium, and optionally tin. The amount of each of gallium, indium, and optionally tin present in the eutectic metal alloy may vary widely.

In at least one embodiment, the eutectic metal alloy only includes gallium and indium. For example, the eutectic metal alloy including gallium and indium may include from about 72% to about 84%, about 74% to about 82%, about 76% to about 80%, or about 78% gallium. In another example, the eutectic metal alloy including gallium and indium may include from about 15% to about 27%, about 17% to about 25%, about 19% to about 23%, or about 21% indium. In yet another example, the eutectic metal alloy including gallium and indium may include about 78.6% gallium and about 21.4% indium. For example, the eutectic metal alloy may be or include METSPEC® 60, which is commercially available from 5N Plus of Montreal, Quebec, Canada.

In another embodiment, the eutectic metal alloy may include gallium, indium, and tin. For example, the eutectic metal alloy including gallium, indium, and tin may include from about 60% to about 72%, about 62% to about 70%, about 64% to about 68%, or about 66% gallium. In another example, the eutectic metal alloy including gallium, indium, and tin may include from about 8% to about 18%, about 10% to about 16%, about 12% to about 14%, or about 13.5% tin. In yet another example, the eutectic metal alloy including gallium, indium, and tin may include from about 14% to about 26%, about 16% to about 24%, about 18% to about 22%, or about 20.5% indium. In an exemplary embodiment, the eutectic metal alloy may include about 66% gallium, about 20.5% indium, and about 13.5% tin. For example, the eutectic metal alloy may be or include METSPEC® 51, which is commercially available from 5N Plus of Montreal, Quebec, Canada.

The eutectic metal alloy may have a relatively high surface tension. For example, the surface tension of the eutectic metal alloy may be sufficiently high such that the eutectic metal alloy may readily form and/or maintain discrete particles when dispersed in a solvent or solution. In another example, the surface tension of the eutectic metal alloy may be sufficiently high such that the discrete particles dispersed in the solvent or solution may not flow or readily flow at room temperature or above its respective melting point. In an exemplary embodiment, as further described herein, external stimulus (e.g., pressure) may be applied to the discrete particles of the eutectic metal alloy to facilitate or allow the flow thereof. For example, pressure may be required to facilitate or allow the flow of the discrete particles of the eutectic metal alloy in the adhesive conductive composition. In at least one embodiment, the only external stimulus utilized to facilitate or allow the flow of the discrete particles of the eutectic metal alloy in the adhesive conductive composition is applied pressure. For example, the discrete particles of the eutectic metal alloy in the adhesive conductive composition may be stimulated to flow without heating the particles, as is often utilized in Field's metal particles.

In at least one embodiment, the surface tension of the eutectic metal alloy may be from about 300 mN/m to about 1500 mN/m. For example, the surface tension of the eutectic metal alloy may be from about 300 mN/m to about 1500 mN/m, about 500 mN/m to about 1400 mN/m, about 800 mN/m to about 1100 mN/m, or about 900 mN/m to about 10000 mN/m. In another embodiment, the surface tension of the eutectic metal alloy may be greater than about 400 mN/m, greater than about 500 mN/m, greater than about 600 mN/m, greater than about 700 mN/m, or greater than about 800 mN/m.

As discussed above, the eutectic metal alloy may readily form discrete particles in the adhesive conductive composition. The discrete particles of the eutectic metal alloy may have a size that is readily printed or deposited via jetting. The discrete particles of the eutectic metal alloy may have a particle size distribution D50 of from about 0.1 µm to about 0.5 µm. For example, the discrete particles of the eutectic metal alloy may have a particle size distribution D50 of from about 0.1 µm to about 0.5 µm, about 0.15 µm to about 0.45 µm, about 0.2 µm to about 0.4 µm, or about 0.2 µm to about 0.35 µm. The discrete particles of the eutectic metal alloy may have a particle size distribution D90 of less than about 1 µm, less than about 0.9 µm, less than about 0.8 µm, or less than about 0.7 µm.

In at least one embodiment, the amount of the eutectic metal alloy present in the adhesive conductive composition may vary widely. For example, the eutectic metal alloy may be present in the adhesive conductive composition in an amount of from about 0.01 weight % to about 90 weight %. For example, the eutectic metal alloy may be present in the adhesive conductive composition in an amount of from about 0.01 weight % to about 90 weight %, about 20 weight % to about 80 weight %, about 30 weight % to about 80 weight %, about 40 weight % to about 70 weight %, or about 50 weight % to about 60 weight %, based on a total weight of the adhesive conductive composition. In another example, the eutectic metal alloy may be present in the adhesive conductive composition in an amount of from about 30 weight % to about 70 weight %. For example, the eutectic metal alloy may be present in the adhesive conductive composition in an amount of from about 30 weight % to about 70 weight %, about 35 weight % to about 65 weight %, about 40 weight % to about 60 weight %, about 45 weight % to about 55 weight %, or about 50 weight % to about 60 weight %, based on a total weight of the adhesive conductive composition.

Amines

The adhesive conductive composition may include one or more amines. The one or more amines may be capable of or configured to stabilize the eutectic metal alloy or one or more components thereof. Illustrative amines may be or include, but are not limited to, organoamines such as propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, N,N,N',N'-tetramethylbutane-1,4-diamine, 3-methoxypropylamine, pentaethylenehexamine, 2,2-(ethylenedioxy)diethylamine, tetraethylenepentamine, triethylenetetramine, diethylenetriamine, and the like, or mixtures thereof. In an exemplary embodiment, the adhesive conductive composition includes tetraethylenepentamine.

In at least one embodiment, the amount of the amines present in the adhesive conductive composition may vary widely. For example, the amines may be present in the adhesive conductive composition in an amount of from about 0.01 weight % to about 90 weight %. In another example, the amines may be present in the adhesive conductive composition in an amount of from about 0.01 weight % to about 90 weight %, about 20 weight % to about 80 weight %, about 30 weight % to about 80 weight %, about 40 weight % to about 70 weight %, or about 50 weight % to about 60 weight %, based on a total weight of the adhesive conductive composition.

In at least one embodiment, the weight ratio of the amines to the eutectic metal alloy may be from about 0.1:1 to about 2:1, about 0.5:1 to about 1.5:1, about 0.75:1 to about 1.5:1, or about 1:1 to about 1.25:1. In another embodiment, the weight ratio of the amines to the eutectic metal alloy may be from about 1:1 to about 5:1, about 1.5:1 to about 4:1, about 2:1 to about 3:1, or about 1:1 to about 1.2:1.

Epoxy Resin

The adhesive conductive composition may include any curable epoxy resin capable of or configured to maintain any conductive pathways formed in the adhesive conductive composition when pressure is applied to the eutectic metal alloy particles thereof. Illustrative epoxy resins may include, but are not limited to, polyglycidylether of bisphenol A, an epoxy group-containing acrylic resin (e.g., glycidyl group-containing acrylic resin), non-glycidyl epoxy resins, cycloaliphatic epoxy resins, various polyglycidylethers of polyol (e.g., 1,6-hexanediol, trimethylol propane and trimethylol ethane), various polyglycidylesters of polycarboxylic acid (e.g., phthalic acid, terephthalic acid, isophthalic acid, hexahydrophthalic acid, methyl hexahydrophthalic acid, trimellitic acid, and pyromellitic acid), various alicyclic epoxy group-containing compounds (e.g., bis(3,4-epoxy cyclohexyl) methyl adipate), hydroxy amide (e.g., triglycidylisocyanurate and β-hydroxyalkyl amide), and the like, or mixtures or combinations thereof. In at least one embodiment, the epoxy resin may be selected from one or more of a bisphenol A epoxy resin, a phenol formaldehyde resin (also known as a Novolak resin), an acrylic acid modified epoxy and a cycloaliphatic or heterocyclic rings based epoxy with one or more cross-linkers, where the cross-linkers may include any one or more of phenols, amines, and anhydrides.

In at least one embodiment, the epoxy resin may be or include, but is not limited to epoxy resins having aromatic moieties. Representative glycidyl-ether epoxy resins having aromatic moieties may include diglycidyl ethers of bisphenol-A (DGEBA), which may be synthesized by reacting bisphenol-A with epichlorohydrin in the presence of a basic catalyst and which has the following structure (I).

where X, the number of repeating units, may be from 0 to 25, such as from about 2 to about 20 or about 5 to about 15.

DGEBA resins are commercially available and are marketed under the trade designations Epon® 828, Epon® 1001, Epon® 1004, Epon® 2004, Epon® 1510, and Epon® 1310 from Hexion, Inc., Columbus, Ohio and D.E.R.® 331, D.E.R.® 332, D.E.R.® 334, and D.E.R.® 439, available from Dow Chemical Co., Midland, Mich.

Other suitable bisphenol-A epoxy resins include Bisphenol A propoxylate diglycidyl ether, which is also commercially available, e.g., from Sigma-Aldrich, Inc. and has the following structure (II).

(II)

(V)

wherein n=1.

Other suitable glycidyl ether epoxy resins comprising aromatic moieties include bis(4-hydroxyphenyl)methane (known as bisphenol F) and diglycidyl ether of bromobisphenol A (2,2-bis(4-(2,3-epoxypropoxy)3-bromo-phenyl) propane). Bisphenol-F based epoxy resins are commercially available, for example D.E.R.® 354 and D.E.R.® 354LV, each available from The Dow Chemical Company, Midland, Mich.

Additional glycidyl ether epoxy resins comprising aromatic moieties that may be used with the instant compositions include phenol and cresol novolacs. As is known in the art, these epoxies may be prepared by reacting phenols or cresols, in excess, with formaldehyde in the presence of an acidic catalyst to produce phenolic novolac resin. Novolac epoxy resins are then synthesized by reacting the phenolic novolac resin with epichlorohydrin in the presence of sodium hydroxide as a catalyst. A representative phenol novalac is depicted in formula (III)

(III)

wherein n=0-5 wherein 'n' is a number of repeat units, which may, for example be from 0 to 5.

Examples of epoxy phenolic novolac resins including epoxy bisphenol A novolac resins useful in some embodiments disclosed herein include those available under the tradenames D.E.R.® 431 and D.E.R.® 438 from The Dow Chemical Company, Midland, Mich., and EPON® SU-8, available from Hexion Specialty Chemicals, Columbus, Ohio.

Other suitable epoxy resins containing aromatic groups include those that can be prepared by the reaction of aromatic alcohols such as biphenyl diols and triphenyl diols and triols with epichlorohydrin. One representative compound is tris-(hydroxyl phenyl)methane-based epoxy available from Huntsman Corporation, Basel, Switzerland as TACTIX® 742.

Additional suitable epoxy resins include glycidal amines. Glycidal amines are formed by reacting epichlorohydrin with an amine, such as an aromatic amine. An example of a suitable glycidal amine is tetraglycidyl methylene dianiline, which is represented by structure (IV).

Additional suitable epoxy resins include aliphatic epoxy resins. Aliphatic epoxy resins are known in the art and include glycidyl epoxy resins and cycloaliphatic epoxides. Glycidyl aliphatic epoxy resins may be formed by the reaction of epichlorohydrin with aliphatic alcohols or polyols to give glycidyl ethers or aliphatic carboxylic acids to give glycidyl esters. This reaction may be done in the presence of an alkali, such as sodium hydroxide, to facilitate the dehydrochlorination of the intermediate chlorohydrin. These resins generally display low viscosity at room temperature, such as a viscosity ranging from about 10 to about 200 mPa·s. Exemplary glycidyl aliphatic epoxy resins for use in the conductive adhesive composition disclosed herein include trimethylolpropane triglycidyl ether, neopentyl glycol diglycidyl ether, and poly(propylene glycol) diglycidyl ether, which are commercially available, for example, from Sigma-Aldrich, Inc.

Cycloaliphatic epoxides may also be included in the present compositions. Cycloaliphatic epoxides contain one or more cycloaliphatic rings in the molecule to which an epoxide ring is fused. They are formed by the reaction of cyclo-olefins with a peracid, such as peracetic acid. Cycloaliphatic epoxides suitable for use in preparing the instant compositions include 3,4-epoxycyclohexylmethyl-3,4-epoxycyclohexane carboxylate, bis(3,4-epoxycyclohexylmethyl)adipate, vinyl cyclohexane dioxide, and the like and are commercially available from, for example, Union Carbide Corporation, a subsidiary of the Dow Chemical Company, Houston, Tex.

One or more epoxy resins can be provided in the conductive adhesive compositions disclosed herein in any suitable or desired amount. In certain embodiments, the at least one epoxy resin is present in the composition in an amount ranging from about 0.01 to about 40 percent, such as from about 5 to about 35 percent, or from about 10 to about 25 percent, by weight, based on the total weight of the composition.

In an embodiment, the undiluted epoxy resin can have a viscosity of from about 1 cPs to about 16 cPs. For example, the undiluted epoxy resin can have a viscosity of from about 1 cPs to about 16 cPs, about 3 cPs to about 12 cPs, about 5 cPs to about 9 cPs, or about 8 cPs.

In an embodiment, the epoxy resin may be or include a commercially available resist, such as a solder mask paste. One example of a commercially available solder mask paste may include TAIYO S-222NA®, which includes a bisphenol A epoxy resin and is commercially available from Taiyo America Inc. of Carson City, Nev. It should be appreciated that such conventional formulations may not be readily used for jetting applications (e.g., aerosol printing) due to their relatively high viscosity. As such, the adhesive conductive composition and/or epoxy resins described herein may be diluted with any compatible solvent and/or a surfactant to achieve a suitable rheology.

The epoxy resin may be cured at any suitable temperature for the substrate. For example, the epoxy resin may be cured at a temperature relatively lower than the melting point of a polymeric or plastic substrate, such as a flexible or rigid flexible substrate. In at least one embodiment, the epoxy resin may be thermally cured at a temperature less than about 150° C., less than about 140° C., less than about 130° C., less than about 120° C., or less than about 110° C. The epoxy resin may be cured in a period of less than about 4 hours, less than about 3 hours, less than about 2 hours, or less than about 1 hour.

Any suitable amount of epoxy resin can be employed in the adhesive conductive composition that will result in the final resist mask having suitable characteristics after curing. For example, the epoxy resin may be present in the adhesive conductive composition in an amount of from about 50% to about 80% by weight relative to the total weight of the adhesive conductive composition, such as about 60 or 65% to about 75%. In another example, the epoxy resin may be present in the adhesive conductive composition in an amount of from about 10% to about 80% by weight relative to the total weight of the adhesive conductive composition, such as about 10 or 50% to about 75%.

In an embodiment, the adhesive conductive composition or a component thereof may include an effective amount of poly(vinyl phenol) and/or poly(vinyl butyral). The amount of poly(vinyl phenol) and/or poly(vinyl butyral) present in the adhesive conductive composition or the component thereof may be effective to improve adhesion of the adhesive conductive composition. For example, the amount of poly(vinyl phenol) and/or poly(vinyl butyral) present in the adhesive conductive composition or a component thereof may be from about 0.01 weight % to about 50 weight %, about 5 weight % to about 25 weight %, about 10 weight % to about 20 weight %, or about 15 weight %, based on a total weight of the adhesive conductive composition.

Solvent

In at least one embodiment, the solvent may be or include a non-polar solvent. In another embodiment, the solvent may be or include a polar solvent. Illustrative solvents may be or include, but are not limited to, propylene carbonate, ethylene carbonate, 1-cyclohexyl-2-pyrrolidone, diethylene glycol monobutyl ether, isopropanol, 1-methyl-2-pyrrolidone, 2-amino-2-methyl-1-propanol, methyl diethanol amine, pyrazole, benzyl alcohol, 1,3-dimethyl-2 imidazolidinone, propylene glycol monomethyl ether, propylene glycol monomethyl ether acetate (PGMEA), dipropylene glycol monomethyl ether, tripropylene glycol monomethyl ether, propylene glycol mono-t-butyl ether, ethylene glycol ethyl ether acetate, ethylene glycol methyl ether acetate, ethylene glycol butyl ether, diethylene glycol butyl ether and its acetate, propylene glycol methyl ether acetate, dipropylene glycol methyl ether acetate, tripropylene glycol methyl ether acetate, and the like, or mixtures thereof. In an exemplary implementation, the solvent may be or include propylene glycol monomethyl ether acetate (PGMEA) or a cosolvent thereof.

The solvent can be employed in any suitable amount that reduces the viscosity of the epoxy resin sufficiently for aerosol jet printing and still allows formation of a patterned solder mask with acceptable characteristics. For example, the amount of solvent can be at least 20% by weight relative to the total weight of the adhesive conductive composition. In other examples, the amount of solvent can range from about 25% to about 50%, such as about 30% to about 40% or 45% by weight relative to the total weight of the adhesive conductive composition.

Electronic Devices

In certain embodiments, an electronic device is disclosed herein including a substrate, a set of conductive terminals on the substrate, an electronic component opposite the substrate, a set of conductive terminals attached to the electronic component and facing the substrate, and a conductive adhesive composition, such as an anisotropic conductive adhesive composition, disposed between the electronic component and the substrate. The conductive adhesive composition may comprise conductive particles, such as eutectic metal alloy nanoparticles, distributed in an insulating medium in a substantially uniform manner.

An exemplary application of an anisotropic conductive adhesive composition includes a group of conductive elements. The composition may be positioned between two sets of conductive terminals. A charge or field is generated by or passed through a substrate, which may be flexible, to the terminals. The field may pass from one terminal to another terminal through the anisotropic conductive adhesive composition. A top layer, such as an electronic component like a resistor, may comprise a set of conductive contact pads and may cover the anisotropic conductive adhesive composition and the terminals.

To create conductivity from the terminals to the electronic component through the conductive particles, the anisotropic conductive adhesive composition may be sandwiched between the top and bottom layers, i.e., between the substrate and the electronic component. When sandwiched in between, the conductive particles, such as eutectic metal alloy nanoparticles, may deform and provide a larger conductive surface area that contacts the terminals and conductive contact pad.

The substrate may be any suitable substrate including silicon, a glass plate, a plastic film, sheet, fabric, synthetic paper, or mixtures thereof. For structurally flexible devices, plastic substrates such as polyester, polycarbonate, polyimide sheets, polyethylene terephthalate (PET) sheets, polyethylene naphthalate (PEN) sheets, and the like, including mixtures thereof, may be used. The thickness of the substrate can be any suitable thickness, such as from about 10 micrometers to over 10 millimeters with an exemplary thickness being from about 50 micrometers to about 2 millimeters, especially for a flexible plastic substrate, and from about 0.4 to about 10 millimeters for a rigid substrate such as glass or silicon.

Methods

Embodiments of the present disclosure may provide methods for producing a conductive adhesive composition. The method may include combining, mixing, agitating, complexing, or otherwise contacting one or more eutectic metal alloys and one or more amines with one another in a suitable solvent to disperse discrete particles of the eutectic metal alloy in the solvent. For example, the method may include contacting a eutectic metal alloy of gallium, indium, and optionally tin, and an amine, such as tetraethylenepentamine, with one another in a PGMEA solvent to disperse discrete particles of the eutectic metal alloy in the solvent. Dispersing the discrete particles of the eutectic metal alloy in the solvent may include agitating the mixture. For example, dispersing the discrete particles of the eutectic metal alloy in the solvent may include sonicating (e.g., probe sonicating) the mixture. The method may also include ligand functionalizing the particles of the eutectic metal alloy with the amine.

Embodiments of the present disclosure may also provide methods for electrically or conductively coupling one or more components with one another with any of the conductive adhesive compositions disclosed herein. For example, embodiments of the present disclosure may provide methods for electrically coupling one or more components with one another to fabricate a printed circuit board or a component (e.g., resistor) thereof. As used herein, the term or expression "printed circuit board" may represent a generic term or expression for processed 'printed wiring', where predetermined conductive patterns may be used to interconnect electronic components on a common insulating substrate. Illustrative printed circuit boards may be or include, but are not limited to, single-sided, double-sided, and multilayer boards that may be made with rigid, flexible, and/or rigid-flex materials.

Figure 1A:
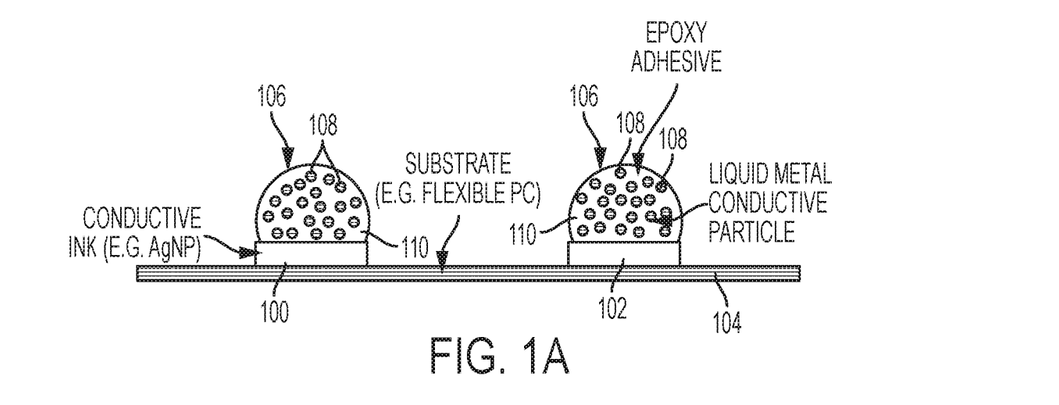
FIGS. 1A-1C illustrate an exemplary method for coupling a first component with a second component with an exemplary conductive adhesive composition, according to one or more embodiments disclosed.
Figure 1B:
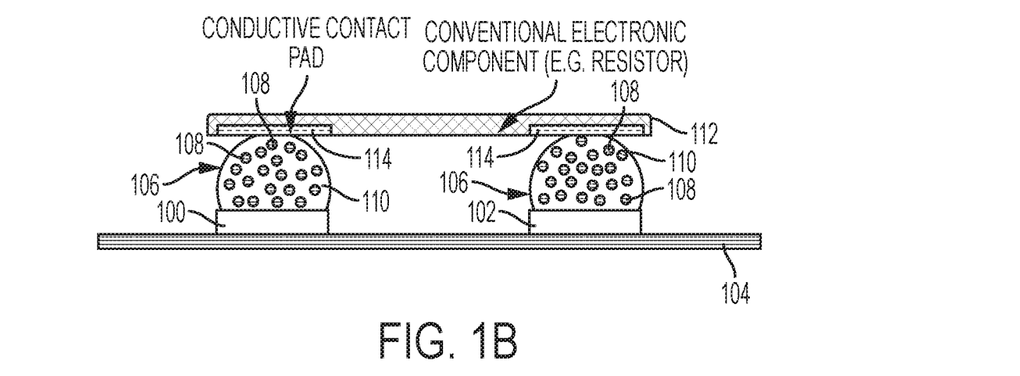
Figure 1C:
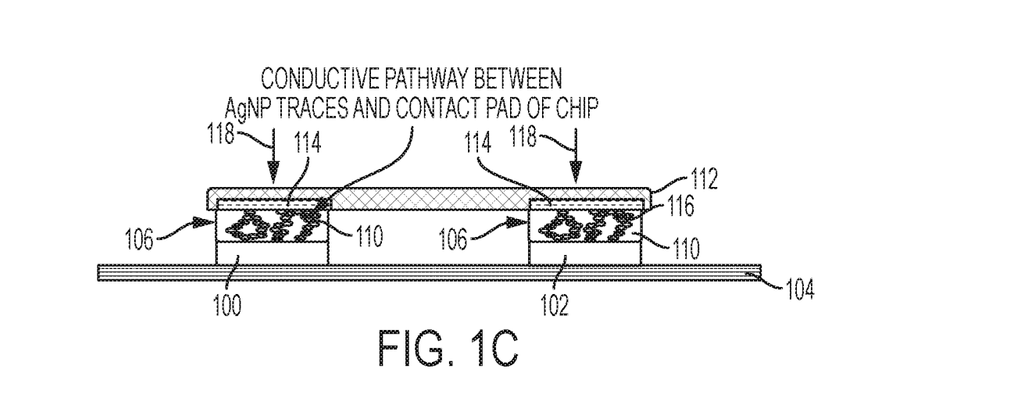

FIGS. 1A-1C illustrate an exemplary method for coupling a first component 100 and a second component 102 with one another on a substrate 104, according to one or more embodiments disclosed. The method may include depositing the first component 100 and the second component 102 on the substrate 104 (e.g., flexible or rigid substrate), as illustrated in FIG. 1A. The first and second components 100, 102 may be deposited on the substrate 104 via any suitable method, such as via solution depositing and/or jetting (e.g., ink jetting). As used herein, the term "solution depositing" or "solution deposition" may refer to a process whereby a liquid is deposited or contacted with a substrate. Solution deposition may be utilized to form a coating or pattern. Illustrative solution deposition techniques may include, but are not limited to, spin coating, dip coating, spray coating, slot die coating, flexographic printing, offset printing, screen printing, gravure printing, ink jet printing, aerosol jet printing and the like.

In at least one embodiment, each of the first and second components 100, 102 may be an electrode (e.g., pad) fabricated from a conductive ink, such as a silver particle or nanoparticle based conductive ink. The method may also include depositing the conductive adhesive composition 106 on each of the first and second components 100, 102 via solution deposition or jetting, as illustrated in FIG. 1A. As illustrated in FIG. 1A, the conductive adhesive composition 106 may include particles of the eutectic metal alloy 108 dispersed in an epoxy resin 110.

The method may also include disposing an electronic component 112, such as a resistor, having conductive contact pads 114, adjacent the conductive adhesive composition 106, as illustrated in FIG. 1B. The method may also include applying an external stimulus or stimuli to provide or form conductive pathways 116 in the conductive adhesive composition 106, as illustrated in FIG. 1C. The external stimuli utilized to form the conductive pathways 116 may include a biasing force or an applied pressure to the conductive adhesive composition 106, as indicated by arrow 118. As illustrated in FIG. 1C, applying pressure or the biasing force 118 to the conductive adhesive composition 106 may break the surface tension of the discrete particles 108 of the eutectic metal alloy to thereby form the conductive pathways 116. The method may also include curing the epoxy resin 110 to maintain the conductive pathways 116 and thereby electrically couple the first component 100 with the second component 102 via the electronic component 112 and the conductive pathways 116.

Figure 2A:
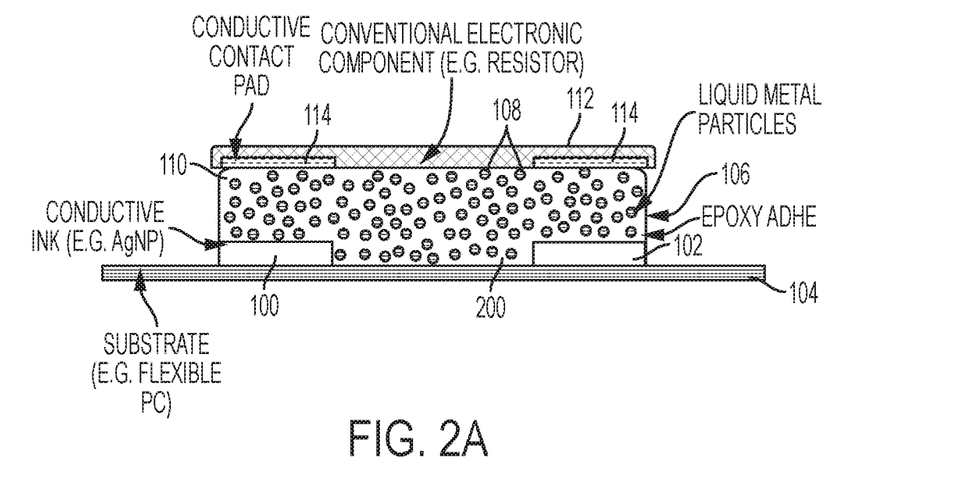
FIGS. 2A-2B illustrate another exemplary method for coupling a first component with a second component with an exemplary conductive adhesive composition, according to one or more embodiments disclosed.
Figure 2B:
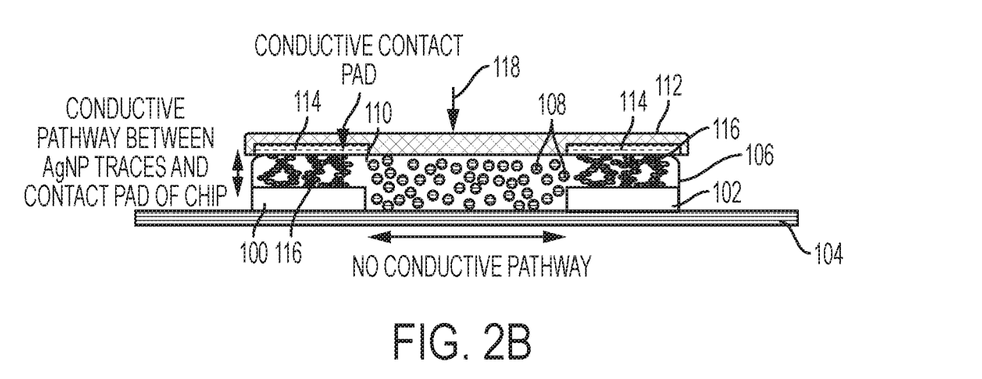

FIGS. 2A-2B illustrate another exemplary method for coupling a first component 100 and a second component 102 with another on a substrate 104, according to one or more embodiments disclosed. FIGS. 2A-2B may be similar in some respects to the method described in FIGS. 1A-1C, and therefore may be best understood with reference to the description of FIGS. 1A-1C, where like numerals may designate like components and will not be described again in detail.

As illustrated in FIG. 2A, the method may include depositing the first component 100 and the second component 102 on the substrate 104. The method may also include depositing the conductive adhesive composition 106 on the first and second components 100, 102, as illustrated in FIG. 2A. The method may also include depositing the conductive adhesive composition 106 in a gap or space 200 defined between the first and second components 100, 102. The method may further include disposing the electronic component 112 adjacent the conductive adhesive composition 106, and applying the biasing force 118 to the conductive adhesive composition 106 to thereby form conductive pathways 116 therein, as illustrated in FIG. 2B. The method may also include curing the epoxy resin 110 to maintain the conductive pathways 116 and thereby electrically couple the first component 100 with the second component 102 via the electronic component 112 and the conductive pathways 116. As illustrated in FIG. 2B, the conductive pathways 116 may not be formed in the conductive adhesive composition 106 disposed in the gap 200 defined between the first and second components 100, 102. As such, there may be no direct conductivity or electrical coupling from the first component 100 to the second component 102 without traversing through the electronic component 112.

In at least one embodiment, the methods disclosed herein may include ink jet printing the conductive adhesive composition onto a substrate or other surface. The methods disclosed herein may also include aerosol jet printing the conductive adhesive composition onto the substrate. As used herein, "aerosol jet printing" may refer to a process or technique of atomizing a liquid (e.g., the conductive adhesive composition) to produce droplets of the liquid on a micron or sub-micron scale. The atomized droplets of aerosol jet printing may be entrained in a gaseous stream and delivered to a print head where an annular flow of gas may be introduced around the aerosol stream to focus the droplets into a collimated beam or path. The combined gas streams may be propelled by the print head through a converging nozzle that may compress the aerosol stream into a relatively smaller diameter (i.e., 1-10 µm). The jet may be proposed out of the print head and deposited onto the substrate.

The substrates may be any suitable substrate or substrate compatible with the conductive adhesive composition. Illustrative substrates may be or include, but are not limited to, silicon, a glass plate, plastic or polymeric materials (e.g., a plastic film), sheet, fabric, synthetic paper, and the like. Illustrative polymeric materials may be or include, but are not limited to, polyester, polycarbonate, polyimide sheets, polyethylene terephthalate (PET) sheets, polyethylene naphthalate (PEN) sheets, and the like.

In at least one embodiment, the conductive adhesive composition or a component thereof may be cured via heating. As used herein, the term "heating" may refer to any technique that can impart sufficient energy to at least partially cure the aqueous ink composition or the epoxy resin thereof. Illustrative heating techniques may be or include, but are not limited to, thermal heating (e.g., hot plate, oven, burner, etc.), infrared (IR) radiation, laser beam, flashlight, microwave radiation, ultraviolet (UV) radiation, and the like, and combinations thereof. In some embodiments, the conductive adhesive composition may be cured at a temperature of from about 80° C. to about 200° C., such as from about 100° C. to about 180° C., or from about 120° C. to about 160° C., and for a period of time of from about 0.5 to about 6 hours, from about 1 to about 4 hours, or from about 2 to about 3 hours. In at least one embodiment, the present composition can be cured at about 160° C. for about 6 hours or at about 200° C. for about 0.5 hours.

EXAMPLES

The examples and other implementations described herein are exemplary and not intended to be limiting in describing the full scope of compositions and methods of this disclosure. Equivalent changes, modifications and variations of specific implementations, materials, compositions and methods may be made within the scope of the present disclosure, with substantially similar results.

Example 1

Exemplary conductive adhesive compositions were prepared by combining varying eutectic alloys with an amine in a solvent. Particularly, an gallium-indium-tin eutectic alloy including about 66% about Ga, 20.5% In, and about 13.5% Sn was combined with tetraethylenepentamine in propylene glycol monomethyl ether acetate (PGMEA) to prepare a first exemplary conductive adhesive composition (Test 1), and an gallium-indium eutectic alloy including about 78.6% Ga and about 21.4% was combined with tetraethylenepentamine in PGMEA to prepare a second exemplary conductive adhesive composition (Test 2).

To prepare each of the Test 1 and Test 2 conductive adhesive compositions, about 300 mL of the PGMEA solvent was placed in a beaker with a magnetic stir bar and heated in a water bath with a hot plate. About 60 g of the amine, tetraethylenepentamine, was combined with the PGMEA under stirring. About 20.8 g of a respective eutectic alloy was then added to the mixture of the PGMEA and the amine, and stirred for about two minutes. After stirring, each of the solutions was placed into an ice bath maintained at a temperature of less than 40° C., and probe sonicated at 100% amplitude/power for about 8 to about 15 minutes. Each of the solutions was then cooled to a temperature of about 10° C., which resulted in a gray suspension. Each of the gray suspensions was then centrifuged at 3000 rpm for about 15 minutes, and the clear supernatant was then decanted and the precipitate was dispersed in fresh PGMEA. After dispersing the precipitate in the PGMEA, the mixture was centrifuged again at 3000 rpm for about 15 minutes, and the clear PGMEA supernatant was again decanted. The resulting precipitate or particles from the centrifuge tube was then allowed to dry overnight. It should be appreciated that the final yield of the particles in each of the solutions was greater than 95%.

Example 2

The particle size distribution of each of the Test 1 and Test 2 conductive adhesive compositions prepared in Example 1 was analyzed using a NANOTRAC U2275E particle size analyzer. The particle size distribution of each of the Test 1 and Test 2 conductive adhesive compositions is summarized in Table 1.

TABLE 1

Particle Size Distribution of Test Conductive Adhesive Compositions

| Percentile ($D_x$) | Test 1 (μm) | Test 2 (μm) |
| --- | --- | --- |
| $D_{10}$ | 0.0826 | 0.0330 |
| $D_{20}$ | 0.2143 | 0.1019 |
| $D_{30}$ | 0.2738 | 0.1513 |
| $D_{40}$ | 0.317 | 0.1927 |
| $D_{50}$ | 0.361 | 0.2339 |
| $D_{60}$ | 0.418 | 0.2804 |
| $D_{70}$ | 0.546 | 0.345 |
| $D_{80}$ | 0.753 | 0.455 |
| $D_{90}$ | 0.973 | 0.680 |
| $D_{95}$ | 1.186 | 0.812 |

Example 3

The liquid metal nanoparticles prepared in Example 1 were used to prepare conductive adhesive compositions. For example, about 12 g of an epoxy resin was diluted with about 12 g of PGMEA solvent. The solution was vortexed at about 3000 rpm for about 10 s to ensure the resin was dissolved. To this solution, about 16 g of the liquid metal particles (Test 1) were added. The solid content of the conductive adhesive composition was about 40 weight %. The conductive adhesive mixture was sonicated for about 5 minutes then rolled on a movil rod roller for about 36 hours. Before aerosol jet printing, the conductive adhesive mixture was sonicated for about an additional 5 minutes in a bath sonicator.

The conductive adhesive composition of Example 3 was aerosol jet printed onto rigid polycarbonate substrates patterned with silver (Ag) electrodes having a 5 mm wide gap disposed therebetween. The conductive adhesive composition was printed with an aerosol printer, namely, an OPTOMEC Aerosol Jet System set at Pneumatic Aerosol Mode (PA). A 300 μm nozzle was used with a 3 mm offset distance between the nozzle and the substrate. The printing rate was maintained at 10 mm/s, and the following gas flow parameters were used: Sheath Gas=50 cm$^3$/min, Atomization Gas=650 cm$^3$/min, Exhaust gas=630 cm$^3$/min.

Resistance of the conductive adhesive composition was analyzed in two studies. In a first study, schematically illustrated in FIGS. 1A-1C, a conductive adhesive composition 106 was directly printed on each of the silver electrodes 100, 102 (i.e., on pads of the electrodes), a 100 ohm (Ω) resistor 112 was then placed over the conductive adhesive composition 106 to bridge the gap between the printed conductive adhesive composition 106, and a pressure 118 was applied to the conductive adhesive composition 106 via the resistor 112 to allow the particles of the eutectic metal alloy 108 to flow and form the conductive pathways 116. In a second study, schematically illustrated in FIGS. 2A-2B, the conductive adhesive composition 106 was directly printed on each of the silver electrodes 100, 102 and in the 5 mm gap 200 therebetween, a 100Ω resistor 112 was disposed over the conductive adhesive composition 106, and a pressure 118 was applied to the conductive adhesive composition 106 via the resistor 112 to allow the particles of the eutectic metal alloy 108 to flow and form the conductive pathways 116. The resistances between the silver electrodes 100, 102 of each of the studies were then evaluated. It should be appreciated that the conductive adhesive composition was determined to be sufficiently conductive if the measured resistance was 100Ω, which indicated that the conductive adhesive was not contributing additional resistance to the 100Ω of the resistor. In the first study, the measured resistance was about 110 ohms.

In the second study, the measured resistance between the silver electrodes 100, 102 was also about 110Ω. The resistance is close to the given value of the resistors used, suggesting that the conductive adhesive did not significantly contribute additional resistance to the circuitry (an increase of about 10 ohms). Without being bound by theory, it is believed that the additional 10Ω observed may be at least partially contributed by the resistance in the silver electrodes, the contact resistance between the probes of the digital multimeter and the silver electrodes, the conductive adhesive composition, or any combination thereof. Since a resistance was observed/measured, it should be appreciated that the conductive adhesive composition functioned anisotropically, as no shorting across the gap (e.g., a conductive pathway) was observed even though the adhesive was disposed in the gap spanning the electrodes. As such, a pressure, such as the pressure applied between the resistor and the pads of the electrode, was necessary for conductivity to be observed.

It should be appreciated that similar trends in the conductive adhesive composition were observed for both the flexible and rigid substrates. It was further observed that the inventive conductive adhesive compositions disclosed herein did not need to be heated to allow the liquid metals to flow. This is surprising as Field's metal particles are required to be heated above the melting point (above room temperature) prior to applying pressure.

The present disclosure has been described with reference to exemplary implementations or embodiments. Although a limited number of embodiments have been shown and described, it will be appreciated by those skilled in the art that changes may be made in these implementations without departing from the principles and spirit of the preceding detailed description. It is intended that the present disclosure be construed as including all such modifications and alterations insofar as they come within the scope of the appended claims or the equivalents thereof.

What is claimed is:

1. A conductive adhesive composition or a jettable ink adhesive composition, comprising: a eutectic metal alloy, an amine, and a solvent, wherein the eutectic metal alloy comprises from 60% to 72% gallium, from 8% to 18% indium, and from 14% to 26% tin.

2. The conductive adhesive composition of claim 1, wherein the amine is selected from the group consisting of propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, N,N,N', N'-tetramethylbutane-1,4-diamine, 3-methoxypropylamine, pentaethylenehexamine, 2,2-(ethylenedioxy)diethylamine, tetraethylenepentamine, triethylenetetramine, diethylenetriamine, and combinations thereof.

3. The conductive adhesive composition of claim 2, wherein the amine consists of tetraethylenepentamine.

4. The conductive adhesive composition of claim 1, wherein the solvent comprises propylene glycol monomethyl ether acetate.

5. The conductive adhesive composition of claim 1, further comprising an epoxy resin.

6. The conductive adhesive composition of claim 1, wherein the eutectic metal alloy consists of gallium, indium, and tin.

7. The conductive adhesive composition of claim 1, wherein the amine comprises tetraethylenepentamine, and wherein the solvent comprises propylene glycol monomethyl ether acetate.

8. The conductive adhesive composition of claim 7, wherein:
   the conductive adhesive composition consists of the eutectic metal alloy, the amine, and the solvent;
   the amine consists of tetraethylenepentaamine;
   the solvent consists of propylene glycol monomethyl ether acetate; and
   the eutectic metal alloy consist of gallium, indium, and tin.

9. The conductive adhesive composition of claim 7, further comprising an epoxy resin.

10. The conductive adhesive composition of claim 9, wherein:
    the conductive adhesive composition consists of the eutectic metal alloy, the amine, the solvent, and the epoxy resin;
    the amine consists of tetraethylenepentaamine, the solvent consists of propylene glycol monomethyl ether acetate; and
    the eutectic metal alloy consist of gallium, indium, and tin.

11. A method for preparing a conductive adhesive composition, comprising contacting a eutectic metal alloy with an amine in a solvent to prepare liquid metal particles of the eutectic metal alloy dispersed in the solvent, wherein the eutectic metal alloy comprises from 60% to 72% gallium, from 8% to 18% indium, and from 14% to 26% tin.

12. The method of claim 11, wherein the amine comprises tetraethylenepentamine.

13. The method of claim 11, wherein the solvent comprises propylene glycol monomethyl ether acetate.

14. The method of claim 11, further comprising contacting the liquid metal particles with an epoxy resin.

15. A conductive adhesive composition prepared according to the method of claim 11.

16. The conductive adhesive composition of claim 11, wherein the eutectic metal alloy consists of gallium, indium, and tin.

17. A printed electronic, comprising:
    a flexible substrate;
    a plurality of conductive terminals;
    a conductive adhesive composition disposed adjacent the conductive terminals, wherein the conductive adhesive composition comprises a eutectic metal alloy, an amine, and a solvent, wherein the eutectic metal alloy comprises from 60% to 72% gallium, from 8% to 18% indium, and from 14% to 26% tin;
    an electronic component disposed adjacent the conductive adhesive composition,
    wherein the plurality of conductive terminals are electrically coupled with one another via the conductive adhesive composition and the electronic component.

18. The printed electronic of claim 17, wherein the plurality of conductive terminals are electrically coupled with one another only via the conductive adhesive composition and the electronic components.

19. The conductive adhesive composition of claim 17, wherein the eutectic metal alloy consists of gallium, indium, and tin.

* * * * *